United States Patent [19]

Rand et al.

[11] Patent Number: 4,638,484

[45] Date of Patent: Jan. 20, 1987

[54] SOLID STATE LASER EMPLOYING DIAMOND HAVING COLOR CENTERS AS A LASER ACTIVE MATERIAL

[75] Inventors: Stephen C. Rand, Agoura; Larry G. DeShazer, Palos Verdes Estates, both of Calif.

[73] Assignee: Hughes Aircraft Company, Los Angeles, Calif.

[21] Appl. No.: 673,304

[22] Filed: Nov. 20, 1984

[51] Int. Cl.⁴ ............................................. H01S 3/16
[52] U.S. Cl. .................................................... 372/42
[58] Field of Search ............................... 372/41, 42, 74

[56] References Cited

U.S. PATENT DOCUMENTS 3,970,960  7/1976  Mollenauer ........................... 372/42

Primary Examiner—William L. Sikes
Assistant Examiner—Robert E. Wise
Attorney, Agent, or Firm—Wanda K. Denson-Low; A. W. Karambelas

[57] ABSTRACT

A diamond (10) containing H3 and N3 color centers is employed as a laser active material in a color center laser. When excited by a suitable optical pumping source (22), the H3 color centers exhibit laser action and provide a beam (26, 28) which is tunable over the range of 500 to 600 nanometers.

20 Claims, 4 Drawing Figures

SOLID STATE LASER EMPLOYING DIAMOND HAVING COLOR CENTERS AS A LASER ACTIVE MATERIAL

BACKGROUND OF THE INVENTION

This invention relates to lasers and, more particularly, to the use of a diamond having color centers as a laser active material capable of operating at room temperature in a tunable laser.

Over the years many attempts have been made to construct tunable lasers which have long shelf life and which operate reliably for long periods of time. A laser having these characteristics would find wide ranging applications in the fields of communications, medicine and materials analysis.

One type of tunable laser, known as a dye laser, employs an organic dye in solution as the active medium. The dye is optically pumped using a flashlamp or laser. Laser action occurs through the emission of light by the excited dye molecules in an optical cavity. By employing multiple dye solutions, dye lasers can be tuned over a wide range of wavelengths including the ultraviolet, visible and infrared spectra.

However, dye lasers possess several disadvantages which severely limit their usefulness in applications requiring portability and long life. For example, the mechanization of a dye laser requires a continuous flow of the dye solution. This necessitates a substantial amount of expensive and bulky hardware including pumps, tanks, valves and other fluid control apparatus.

Another requirement of the dye laser is that the temperature of the dye solution must be maintained within a narrow range close to room temperature. This necessitates a system to cool the dye solution. Yet another limiting characteristic of the dye laser is that the dyes must be replaced very frequently due to photochemical disassociation (which may even take place with exposure to ambient room light), optical bleaching and thermal degradation. Dye replacement is often required on a daily basis which is both expensive and time-consuming. The dye solution must also be changed whenever it is necessary to shift the tuning range of the laser.

Another type of tunable laser is the color center laser. This type of laser employs as a host material an alkali halide crystal which has been suitably processed to form within it a number of color centers. At the present time, the more successful of the color center lasers employ the $F_2^+$, $F_A(II)$, and $F_B(II)$ centers to provide a tunable laser. In general, the tuning range is limited to the near infrared region. Tunable color center lasers of the type described above are disclosed in U.S. Pat. No. 3,970,960, entitled Broadly Tunable Continuous-Wave Laser Using Color Centers, issued July 20, 1976, to L. F. Mollenauer.

Compared to dye lasers, the color center laser is relatively high in efficiency and exhibits good frequency stability. Color center lasers are potentially useful for space communications and satellite applications since the solid state host crystal enables the use of apparatus which is more portable than that employed for dye lasers and which is potentially trouble-free when operated in zero gravity.

Prior art color center lasers do, however, possess a number of disadvantages which limit their usefulness in these and other applications. For example, in order to create the desired color centers in the alkali halide crystal, it is necessary to perform a number of time consuming process steps such as cooling and X-ray irradiating the crystal. Due to the hygroscopic nature of alkali halide materials, they require special handling to prevent degradation of the material. They must be held at cryogenic temperatures to avoid thermal decomposition of the color centers after they are formed. These materials are also easily damaged when operated at high excitation levels thus limiting their output power.

The color centers formed in alkali halide host crystals tend to bleach out during the operation of the laser which leads to frequent reprocessing or replacement of the host material. In order to reduce the bleaching effect, some color center lasers employ elaborate systems for operating the host material at different polarization angles. Even so, replacement or reprocessing of host material remains a serious limitation to the long term reliability of such lasers.

Operation of color center lasers at room temperature is severely limited due to a low quantum efficiency and thermal instabilities of the centers at these temperatures. Cooling of the crystal is generally necessary to maintain efficient laser operation and low thermal conductivity of alkali halides complicates temperature control of the crystal.

Accordingly, it is an object of the present invention to provide a new tunable laser which operates at room temperature and exhibits long shelf life.

It is another object of the present invention to provide a laser using diamond having color centers as the laser active material.

It is yet another object of the invention to provide a laser which is tunable over the visible spectrum and which exhibits long term stability at high operating power levels.

SUMMARY OF THE INVENTION

The foregoing and other objects of the invention are accomplished by employing as a laser active material in a color center laser a diamond having N3 and H3 color centers. By exciting the H3 color centers at room temperature with a laser operating at 494 nanometers, these centers produce a laser output beam which peaks at 540 nanometers and is tunable over the range of 500 to 600 nanometers.

Unlike color centers in alkali halide crystals, the N3 and H3 centers in diamond do not appear to exhibit any bleaching effects at high energy levels and remain stable at temperatures up to about 800° K. Quantum efficiency also remains high at temperatures up to 500° K. In accordance with the teachings of this invention, a color center laser employing a diamond having N3 and H3 centers can be constructed which is tunable over the range of 500 to 600 nanometers. This laser exhibits virtually unlimited shelf life, and can be operated for long periods of time at room temperature while producing a high energy level laser beam without the need for artificial cooling.

Other objects, features and advantages of the invention will become apparent by reference to the specification taken in conjunction with the drawings in which like elements are referred to by like reference designations throughout the several views.

DETAILED DESCRIPTION OF THE INVENTION

For many years the diamond industry has categorized natural diamonds into two groups, identified as Type I and Type II. Type I diamonds are those having a distinct color cast such as green or yellow, while Type II diamonds are those which appear to be optically clear. Type II diamonds are extremely hard and are believed to have very low levels of impurities, if any at all. These diamonds generally find applications as precious gems. Type I diamonds are considered to have relatively high levels of impurities and are less hard than the Type II variety.

In the present invention, it has been found that certain natural diamonds selected from the Type I group contain H3 and N3 color centers which exhibit laser action when excited by a suitable optical pumping source. Those diamonds suitable for use as a laser active material are selected and prepared as follows.

A number of Type I natural diamonds are irradiated with a light source emitting ultraviolet radiation in the range of 300–400 nanometers. It has been found that those diamonds containing high concentrations of N3 and H3 color centers with high quantum efficiencies exhibit bright fluorescence in response to the ultraviolet light. High concentrations of N3 color centers emit an unusually bright blue fluorescence while high concentrations of H3 centers emit a bright green-yellow fluorescence. As a preliminary step in the selection of desirable laser host materials, those crystals exhibiting the brightest fluorescence in the blue, green and yellow regions are selected as likely candidates.

The fluorescence spectra of each of the candidate crystals are next examined over the range of wavelengths from 400 to 600 nanometers. The spectra may be observed by irradiating the crystal with, for example, an argon laser emitting light at 350 nanometers.

Figure 1:
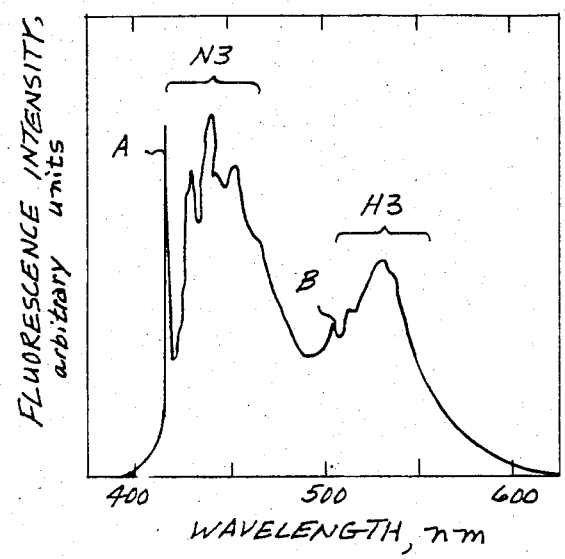
FIG. 1 is a graph showing the fluorescence spectra of a particular diamond containing N3 and H3 color centers.

FIG. 1 shows the fluorescence spectra of one of the diamond crystals selected as a candidate for laser active material. The portions of the spectra representing the N3 and H3 color centers are shown by the brackets in FIG. 1. The spectral peak labelled A in FIG. 1 appears at 415 nanometers and represents the zero-phonon line for the N3 color centers. The peak labelled B in FIG. 1 appears at 503 nanometers and represents the zero-phonon line for the H3 color centers. From the curve in FIG. 1, it may be seen that H3 color centers emit light over the range of 500–600 nanometers with a peak at about 540 nanometers, while light emission from N3 centers extends over the range of 400–500 nanometers with a peak at about 440 nanometers.

It is believed that an N3 color center is produced by a trio of nitrogen atoms which are symmetrically substituted for carbon atoms in the lattice structure of the crystal. The triangular symmetry of these nitrogen atoms provides a color center which appears to be stable at temperatures ranging in excess of 2000° C. A model for N3 centers in diamond has been described in the literature by G. Davies, C. Welbourne and J. Loubser, in Diamond Research 1978, p. 23.

An H3 center, on the other hand, is believed to be formed by a pair of substitute nitrogen atoms separated by a vacancy in the carbon lattice structure. A pair of adjacent substitute nitrogen atoms without a vacancy between them is known as an A aggregate. As described below, H3 centers can be produced in a natural diamond containing A aggregates by generating carbon vacancies and causing these vacancies to migrate to a position between a pair of adjacent nitrogen atoms. A model of H3 centers in diamond has been described in the literature by G. Davies in Diamond Research 1977, p. 15.

From the above discussion, it will be appreciated that both N3 and H3 color centers require the presence of substitutional nitrogen atoms in the crystal. Accordingly, the percentage of nitrogen atoms in a given diamond provides an indication of the concentration of N3 and H3 color centers possible in that crystal. It has been found that diamonds suitable for use as laser active material contain nitrogen substitutions at a level of at least 0.1 atomic percent. The concentration of nitrogen in a particular diamond is determined by using the infrared absorption spectroscopy methods derived by G. Davies in the Journal of Physics C: Solid State Physics 5, p. 2534 (1972).

Figure 2:
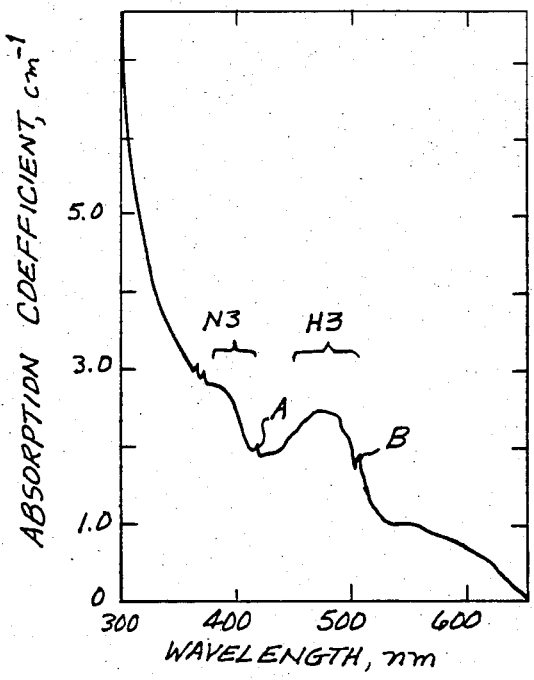
FIG. 2 is a graph showing the absorption spectra of a diamond containing N3 and H3 color centers.

An example of a typical absorption spectra of a diamond containing N3 and H3 color centers suitable for use as a laser active material is shown in FIG. 2. The brackets indicate the portion of the spectra contributed by each of the N3 and H3 centers. The spikes labelled A and B correspond to the zero-phonon lines previously shown in FIG. 1 for the N3 and H3 centers, respectively. The peak of the absorption band is at approximately 370 nanometers for N3 centers and 494 nanometers for H3 centers.

From the curve of FIG. 2 it may be seen that the absorption characteristics of the N3 centers are adjacent those of the H3 centers and it is possible to obtain a high degree of energy transfer between these centers. It is thus to be expected that excitation of both of these centers in a suitable diamond will produce light over a continuous spectrum extending from 400 to 600 nanometers as shown in FIG. 1.

It has been found that the ability of color centers in a diamond crystal to lase is related to the decay time of the luminescence emitted by these centers. The measurement of decay times of the luminescence from N3 color centers in natural diamond is described by M. F. Thomaz and G. Davies in the Proceedings of the Royal Society of London A362, pp. 405–419 (1978). The measurement of decay times of the luminescence from H3 centers in diamond is described by M. D. Crossfield, G. Davies A. T. Collins and E. C. Lightowlers in the Journal of Physical Chemistry 7, pp. 1909–1917 (1974); and by M. Thomaz and C. Braga in the Journal of Physical Chemistry 5, p. L1, (1972).

It is believed that in order to achieve laser action in N3 centers, the luminescence decay time for these centers should be in excess of 30 nanoseconds. The preferred decay time for these centers appears to be 41 nanoseconds. In those diamonds containing both N3 and H3 centers, it has been found that the measured decay time for the N3 centers is a reliable indication of the decay time of the H3 centers in that sample. Further, the minimum and preferred values of decay time listed above for N3 centers may be used as the criteria for selecting diamonds having H3 centers capable of laser action. The decay times of H3 centers are shorter than those of N3 centers and therefore somewhat more difficult to measure, but it is believed that their decay time is approximately one half the measured decay time of N3 centers. Accordingly, the minimum desirable decay time for an H3 center is estimated at 15 nanoseconds with a preferred value of 20 nanoseconds.

An example of the selection of a diamond for use as a laser active material in a color center laser operating without artificial cooling at room temperature is as follows. A Type I diamond having a greenish color and weighing about 1½ carats was chosen as a likely laser active material candidate for the above laser. When irradiated with ultraviolet light in the 300 to 400 nanometer range, the diamond exhibited a bright yellow fluorescence. Fluorescence spectral analysis indicated the presence of both H3 and N3 centers. Measurement of the decay time of the fluorescence of the N3 color centers yielded a value of 41 nanoseconds. The absorption coefficients of this sample are shown by the curve in FIG. 2.

Figure 3:
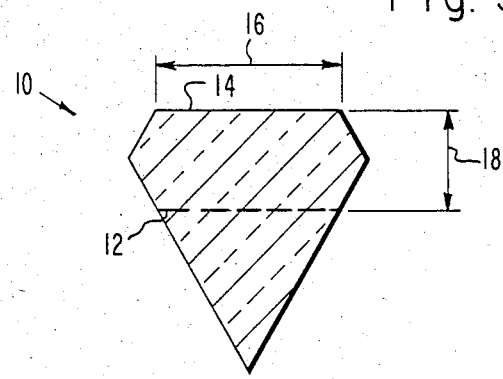
FIG. 3 is a cross-sectional view in elevation of a raw diamond, showing how it is cut to form a laser active material suitable for use in a color center laser.

The shape of this diamond in its uncut form is shown in the cross-sectional view of FIG. 3. To prepare the diamond for use in the laser, the diamond was cut along the dotted line to form a surface 12 parallel to opposing surface 14. Diameter 16 of the surfaces 12 and 14 is approximately 7 millimeters, while the distance between the surfaces 12 and 14 is approximately 2 millimeters. The surfaces 12 and 14 were polished to a flatness of approximately half a wavelength at 6328 Angstroms over a circular area having a diameter of approximately 3 millimeters in the center of each of the surfaces 12 and 14.

Figure 4:
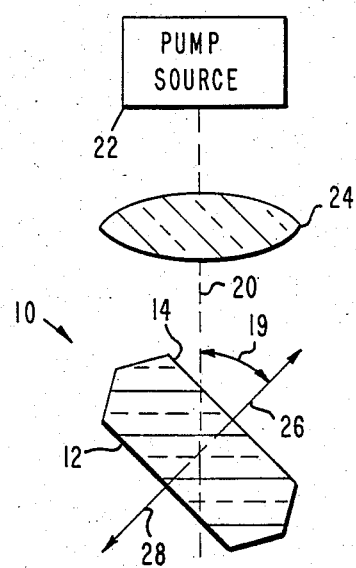
FIG. 4 is a schematic diagram of an experimental test setup for a color center laser which employs the cut diamond of FIG. 3 as a laser active material.

The cut diamond 10 was installed in the laser test setup shown in FIG. 4. The crystal 10 was oriented so that angle 19 between an axis 26 perpendicular to the surfaces 12 and 14 and the axis of an excitation beam 20 was approximately twenty degrees. The excitation beam 20 was provided by a laser pump source 22 which produced light at 494 nanometers, which is approximately the center of the absorption band for the H3 color centers.

Using a focusing lens 24, the excitation beam 20 was focused on the crystal 10. The uncoated surfaces 12 and 14 acted as Fresnel reflectors having approximately 18% reflection. In this experimental test setup, no effort was made to coat the surfaces 12 and 14 or to provide external feedback mirrors.

At an excitation beam intensity of 65 megawatts per square centimeter, the H3 centers in the crystal 10 lased, producing coherent radiation along axes 26 and 28 which are parallel to the [100] crystal plane of the diamond 10, and are normal to the surfaces 12 and 14. The central wavelength of the output laser beam thus produced was approximately 540 nanometers, corresponding to the peak of the fluorescence spectra for the H3 color centers.

In the experimental test setup shown in FIG. 4, no attempt was made to optimize the power conversion efficiency of the crystal 10. The gain coefficient for the H3 centers was calculated as $0.09$ cm$^{-1}$ while the gain coefficient for N3 centers is estimated at about $0.009$ cm$^{-1}$. The efficiency of the setup may be improved significantly by polishing the surfaces 10 and 14 to obtain a smoother surface and by using reflective coatings or external mirrors. It is anticipated that the threshold excitation levels for production versions of color center lasers using a diamond as a laser active material would be comparable to the threshold levels for alkali halide color center lasers.

A production version of a color center laser employing diamond as the laser active material would typically employ a laser resonator which is external to the diamond crystal. Such resonators are well known to those skilled in the art and may consist of plane and/or spherical mirrors, diffraction gratings, prisms, polarizers and/or birefringent filters. The beam produced by the H3 centers in diamond is tunable over the range from 500 to 600 nanometers. As is known to those skilled in the art, the various elements of the resonator may be used to provide for selection of wavelength and polarization of the laser output beam. Examples of a suitable tuning arrangement using mirrors and gratings in color center laser may be found in previously cited U.S. Pat. No. 3,970,960.

It is also to be expected that a color center laser employing diamond as the laser active material may be made to operate either as a continuous-wave laser or as a pulsed laser. Using conventional techniques, the pulses produced in the pulsed laser may be singly Q-switched, repetitively Q-switched, or mode locked.

Unlike the alkali halide host material employed in prior art color center lasers, diamond is non-hygroscopic, and exhibits an extremely high thermal conductance as well as a high threshold of optical damage. Accordingly, a diamond laser active material may be operated at substantial power levels without damage and without the necessity for artificial cooling. The H3 and N3 centers in diamond have also been found to be thermally stable to temperatures above 800° K., and to be photostable at absorption band power levels up to 100 megawatts per square centimeter. Tests run for one hour at power levels of 50 megawatts per square centimeter have shown no evidence of bleaching of the N3 or H3 color centers.

One of the factors leading to the extreme stability of the H3 and N3 color centers in diamond is that these centers are based on substitutional covalent crystal impurities, not ionic crystal impurities as in the case of alkali halide material. The covalent crystal impurities are firmly bound to and are an integral part of the crystal matrix of the diamond, thus providing extreme thermal and photo-stability.

The color centers in alkali halide host material are, for the most part, formed by vacancies and electrons in the host material and may be modified by adjacent impurities. The resultant color centers are characterized as having relatively shallow potential-wells, which contribute to the instability of these centers.

On the other hand, the color centers which are the subject of this invention are formed by substitution of a foreign atom such as nitrogen for a basic component atom such as carbon in the intrinsic crystal lattice. Color centers of this latter type are characterized as having relatively deep potential-wells, which contributes to their extreme stability.

It is believed that the present invention represents the first evidence that, under proper conditions, color centers formed by atomic substitution in covalent or partially covalent crystals may be made to lase. While nitrogen atom substitutions in the elemental carbon lattice of diamond form the basis of the lasing H3 color centers described herein, it is to be expected that other covalent or partially covalent crystals such as silicon or zinc sulfide having color centers formed by atomic substitution may also yield laser active material. For example, the substitution of nitrogen or oxygen atoms for sulfur in the zinc sulfide crystal lattice, or for silicon in that elemental crystal, might be expected to yield stable color centers which lase.

It has been found that H3 color centers may be artificially created in a diamond having large concentrations of A aggregates. The key to forming H3 color centers from A aggregates is to create vacancies in the carbon lattice and to cause individual vacancies to migrate to a position between the two adjacent nitrogen atoms in the A aggregate, thus forming an H3 center.

The artificial formation of H3 color centers in a diamond may be performed as follows. The starting material is a Type I raw diamond containing nitrogen substitutions on the order of 0.1 atomic percent. As described earlier, the level of nitrogen concentration can be determined using infrared absorption spectroscopy methods described in the prior art.

The selected diamond is irradiated with one million electron volt ( or higher energy) electrons using beam current densities in the range of 20 to 50 microamperes per square centimeter for a total dosage of approximately $10^{18}$ electrons per square centimeter. This irradiation step creates carbon vacancies in the diamond sample. In addition to electrons, other sources of radiation which may be used for this step include gamma, neutron and X-ray radiation. However, it has been found that neutron radiation produces undesirable effects on the absorption spectra of the sample.

The irradiated sample is heated above 500° C., preferably to 900° C., and annealed for about 20 hours. This step causes migration of single vacancies to a position between two nitrogen substitution impurities, thus forming an H3 center from an A aggregate. This procedure, particularly the heat treatment, ensures high concentrations of H3 centers.

While the previous discussions have made reference to diamonds having both N3 and H3 centers, a diamond having predominantly N3 color centers with few or no H3 color centers may have significant advantages over those crystals containing both. For example, the absence of H3 centers would prevent portions of the energy targeted for N3 centers from being absorbed by the H3 centers. Accordingly, the N3 centers may be excited to produce a relatively pure laser beam tunable over the 400 to 500 nanometer blue portion of the visible spectrum.

While it is believed that most raw diamonds containing H3 centers also contain N3 centers, it is also believed that there are natural diamonds which contain very low levels of H3 color centers while containing large quantities of N3 centers. Because the fluorescence spectra for N3 color centers lies in the visible blue region, it is believed that such diamonds may be identified by a relatively bright pure blue fluorescence when subjected to ultraviolet light. It may also be possible, using prior art artificial diamond production methods, to create artificial diamonds with high levels of N3 centers by, for example, providing a nitrogen atmosphere during the formation of these diamonds.

A likely candidate for a pump source to excite N3 centers in diamond is a neodymium-glass laser which produces a beam whose third harmonic has a wavelength close to the peak of the absorption band for N3 color centers. In the case of diamonds having both N3 and H3 color centers a likely candidate for a pump source is either a YAG laser or a Xenon flash tube.

While the above described embodiments are illustrative of the application of the principles of this invention, other embodiments may be devised by those skilled in the art without departing from the spirit and scope thereof. It is thus intended that this invention be limited in scope only be the appended claims.

What is claimed is:

1. A laser comprising:
   resonant cavity means for supporting coherent radiation;
   a diamond containing color centers as a laser active material;
   means for exciting the color centers to emit coherent radiation; and
   optical path means for providing an exit path for the radiation from the resonant cavity means.

2. The laser of claim 1 in which the color centers include N3 centers.

3. The laser of claim 2 in which the color centers further include H3 centers.

4. The laser of claim 2 or 3 in which the luminous decay time of the N3 centers ranges from thirty-five to forty-five nanoseconds.

5. The laser of claim 1 in which the color centers include centers formed by substitution of nitrogen atoms for carbon atoms in the diamond crystal lattice.

6. The laser of claim 5 in which the concentration of nitrogen substitutions is approximately 0.1 atomic percent.

7. The laser of claim 1 in which the diamond is shaped to have flat, parallel opposing surfaces.

8. The laser of claim 7 in which the flat opposing surfaces lie in planes which are perpendicular to the plane of the diamond crystal lattice.

9. The laser of claim 1 in which the color centers include H3 centers.

10. The laser of claim 3 or 9 in which the luminous decay time of the H3 centers ranges from eighteen to twenty-two nanoseconds.

11. The laser of claim 1 in which the resonant cavity means further includes means for directing to a target the coherent radiation having a selected wavelength.

12. The laser of claim 1 in which the resonant cavity means further includes means for directing to a target the coherent radiation having a selected polarization angle.

13. A laser comprising:
    resonant cavity means for supporting coherent radiation;
    a laser active material including a crystal structure which is at least partially covalent and which contains color centers formed by substitution of foreign atoms for basic component atoms in the crystal structure lattice;
    means for exciting the color centers to emit coherent radiation; and
    optical path means for providing an exit path for the radiation from the resonant cavity means.

14. A method of forming H3 color centers in a diamond containing A aggregates which have the form of a pair of nitrogen substitutional impurities, comprising the steps of:
    irradiating the diamond with ionizing radiation having sufficient energy to create carbon vacancies; and
    heating the diamond to a temperature in excess of 500° C. for a sufficient time to cause migration of single vacancies to positions between the pairs of nitrogen impurities in the A aggregates, thus forming H3 color centers.

15. The method of claim 15 in which the ionizing radiation comprises electrons having an energy of about one million electron volts or more.

16. The method of claim 15 in which the electrons are directed at the diamond in a beam having a current density in the range from 20 to 50 microamperes per square centimeter.

17. The method of claim 16 in which the diamond is irradiated for a total dosage of approximately $10^{18}$ electrons per square centimeter.

18. The method of claim 14 in which the diamond is heated to at least 900° C. for at least twenty hours.

19. The method of claim 14 in which the diamond is irradiated with gamma rays.

20. The method of claim 14 in which the diamond is irradiated with X-rays.

* * * * *